(12) United States Patent
Qin et al.

(10) Patent No.: US 11,646,207 B2
(45) Date of Patent: May 9, 2023

(54) SILICON OXIDE SILICON NITRIDE STACK STAIR STEP ETCH

(71) Applicant: Lam Research Corporation, Fremont, CA (US)

(72) Inventors: Ce Qin, Fremont, CA (US); Zhongkui Tan, Fremont, CA (US); Qian Fu, Pleasanton, CA (US); Sam Do Lee, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 106 days.

(21) Appl. No.: 16/766,256

(22) PCT Filed: Nov. 29, 2018

(86) PCT No.: PCT/US2018/063141
§ 371 (c)(1),
(2) Date: May 21, 2020

(87) PCT Pub. No.: WO2019/108844
PCT Pub. Date: Jun. 6, 2019

(65) Prior Publication Data
US 2021/0407811 A1 Dec. 30, 2021

Related U.S. Application Data

(60) Provisional application No. 62/593,082, filed on Nov. 30, 2017.

(51) Int. Cl.
*H01L 21/3065* (2006.01)
*H01L 21/311* (2006.01)

(52) U.S. Cl.
CPC .... *H01L 21/3065* (2013.01); *H01L 21/31116* (2013.01); *H01L 21/31144* (2013.01)

(58) Field of Classification Search
None
See application file for complete search history.

(56) References Cited

U.S. PATENT DOCUMENTS 8,598,040 B2 * 12/2013 Le Gouil ............ H01L 21/3065
438/714
2014/0094036 A1 4/2014 Or et al.
(Continued)

FOREIGN PATENT DOCUMENTS

KR  10-2014-0130918  11/2014
WO  2015-103003      7/2015

OTHER PUBLICATIONS

International Search Report from International Application No. PCT/US2018/063141 dated Nov. 29, 2018.
(Continued)

*Primary Examiner* — Stephanie P Duclair
(74) *Attorney, Agent, or Firm* — Beyer Law Group LLP

(57) ABSTRACT

A method for forming a stair-step structure in a stack on a substrate is provided. The method comprises at least one stair step cycle. Each stair step cycle comprises trimming the mask and etching the stack. Etching the stack is provided in a plurality of cycles wherein each cycle comprises etching a $SiO_2$ layer and etching a SiN layer. Etching a $SiO_2$ layer comprises flowing a $SiO_2$ etching gas into the plasma processing chamber, wherein the $SiO_2$ etching gas comprises a hydrofluorocarbon, an inert bombardment gas, and at least one of $SF_6$ and $NF_3$, generating a plasma from the $SiO_2$ etching gas, providing a bias, and stopping the $SiO_2$ layer etch. The etching a SiN layer comprises flowing a SiN etching gas into the plasma processing chamber, comprising a hydrofluorocarbon and oxygen, generating a plasma from the SiN etching gas, providing a bias, and stopping the SiN layer etch.

19 Claims, 8 Drawing Sheets

(56) References Cited

U.S. PATENT DOCUMENTS

| | | | |
|---|---|---|---|
| 2014/0302683 A1* | 10/2014 | Kikuchi | C09K 13/08 |
| | | | 438/718 |
| 2015/0085579 A1 | 3/2015 | Chen | |
| 2015/0140822 A1* | 5/2015 | Yoshimura | H01J 37/3222 |
| | | | 438/694 |
| 2015/0371869 A1* | 12/2015 | Surla | H01L 21/31127 |
| | | | 438/723 |
| 2017/0178894 A1* | 6/2017 | Stone | H01L 21/68742 |

OTHER PUBLICATIONS

Written Opinion from International Application No. PCT/US2018/063141 dated Nov. 29, 2018.

\* cited by examiner

SILICON OXIDE SILICON NITRIDE STACK STAIR STEP ETCH

CROSS REFERENCE TO RELATED APPLICATION

This application claims the benefit of priority of U.S. Provisional Application No. 62/593,082, filed Nov. 30, 2017, which is incorporated herein by reference for all purposes.

BACKGROUND

The present disclosure relates to the formation of semiconductor devices. More specifically, the disclosure relates to the formation of stair-step semiconductor devices.

During semiconductor wafer processing, stair-step features are sometimes required. For example, in 3D flash memory devices, multiple cells are stacked up together in chain format to save space and increase packing density. The stair-step structure allows electrical contact with every gate layer. Such stair-step structures may be formed by a plurality of alternating layers of silicon oxide ($SiO_2$) and silicon nitride (SiN), where such stacks are designated as ONON stacks. ONON stacks may also be used to form other semiconductor devices in addition to stair-step semiconductor devices.

SUMMARY

To achieve the foregoing and in accordance with the purpose of the present disclosure, a method for forming a stair-step structure in a stack on a substrate in a plasma processing chamber, wherein the stack comprises a plurality of silicon oxide and silicon nitride bilayers under a mask is provided. The method comprises at least one stair step cycle. Each stair step cycle comprises trimming the mask and etching the stack. Etching the stack is performed in a plurality of cycles wherein each cycle comprises etching a $SiO_2$ layer and etching a SiN layer. Etching a $SiO_2$ layer comprises flowing a $SiO_2$ etching gas into the plasma processing chamber, wherein the $SiO_2$ etching gas comprises a hydrofluorocarbon, an inert bombardment gas, and at least one of sulfur hexafluoride ($SF_6$) and nitrogen trifluoride ($NF_3$), generating a plasma from the $SiO_2$ etching gas, providing a bias, and stopping the $SiO_2$ layer etch. The etching a SiN layer comprises flowing a SiN etching gas into the plasma processing chamber, wherein the SiN etching gas comprises a hydrofluorocarbon and oxygen, generating a plasma from the SiN etching gas, providing a bias, and stopping the SiN layer etch.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

A traditional approach in etching a stack of silicon oxide ($SiO_2$) and silicon nitride (SiN) bilayers is using a $SiO_2$ layer as a mask to etch a SiN layer in a first process and then using SiN as a mask to etch a $SiO_2$ layer in a second process. Since a SiN layer is used to act as a mask to etch a $SiO_2$ layer and vice versa, selectivity needs to be very high. To provide the desired selectivity, previous methods generated enough polymer to cause tapering of the etch stack sidewalls.

Three dimensional "not and" (3D NAND) staircase etching is an important process. The industry is moving to stacks of 96 bilayers of $SiO_2$ and SiN and beyond. Fast throughput is needed for this process to keep the cost down. However, there are always trade-offs between various parameters including, e.g., profile angle, line edge roughness (LER), etch selectivity, and throughput. How to shorten process time while maintaining vertical profile angle of multiple bilayers, good LER, and free corner rounding/faceting becomes extremely challenging.

Figure 1:
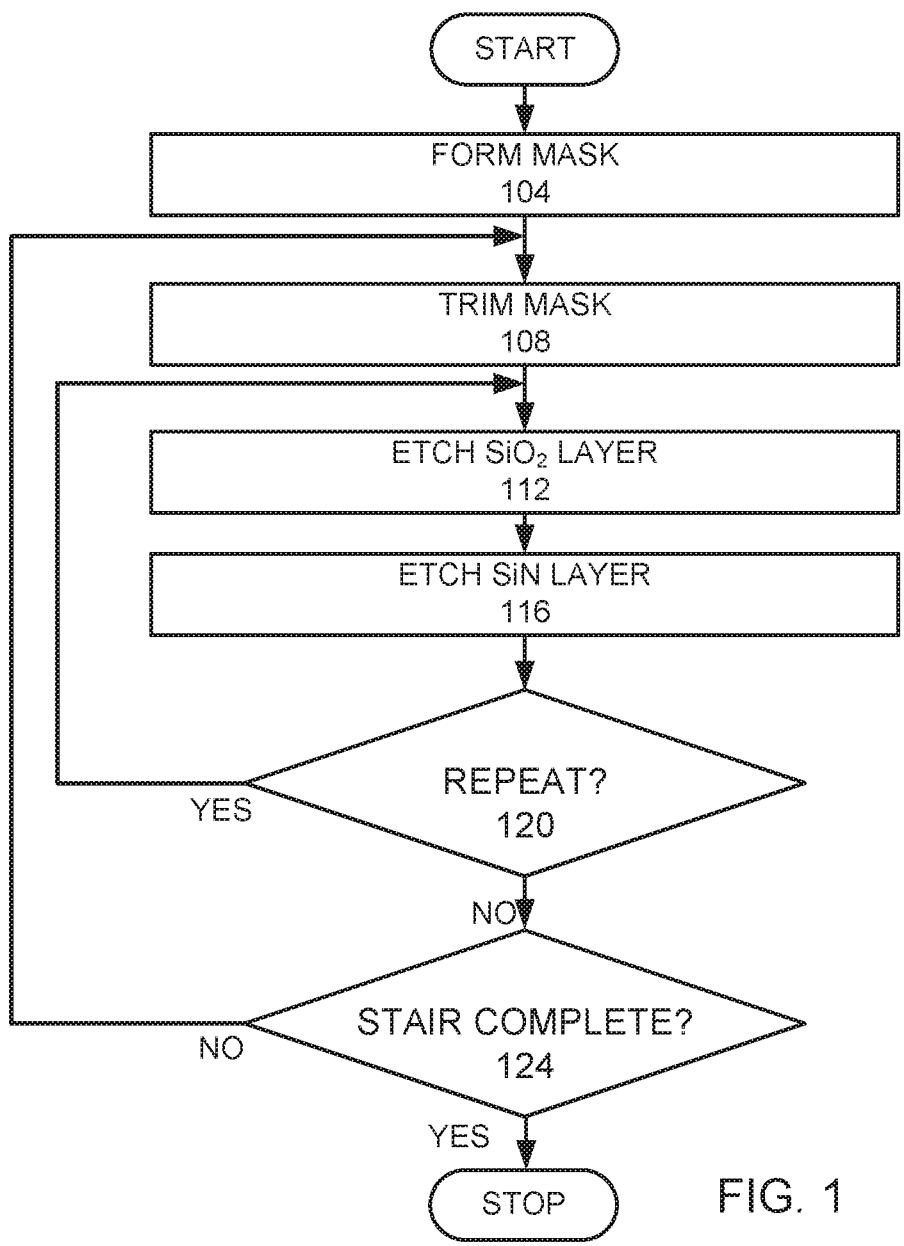
FIG. 1 is a high level flow chart of a process that may be used in an embodiment of the disclosure.

To facilitate understanding, FIG. 1 is a high level flow chart of a process that may be used in an embodiment of the disclosure. The embodiment is used to form a stair-step structure in a stack. An organic mask is formed over a stack of alternating $SiO_2$ and SiN (ONON) layers (step 104).

Figure 2A:
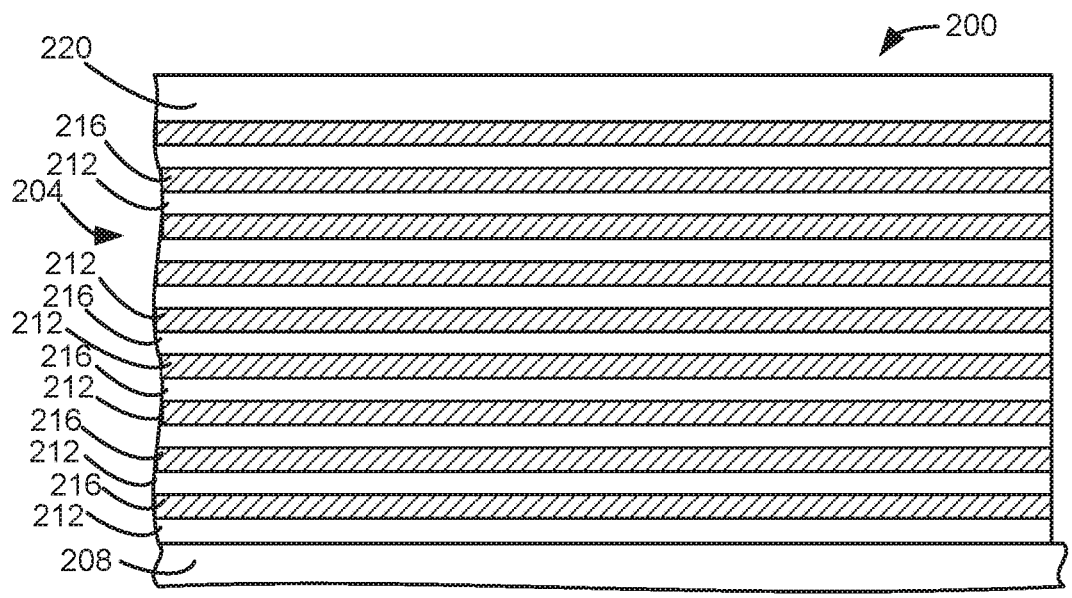
FIGS. 2A-G are schematic cross-sectional views of a stack etched according to an embodiment of the disclosure.

FIG. 2A is a cross sectional view of a stack 200 comprising a plurality of layers of memory stacks 204 formed over a wafer 208. In this embodiment, each memory stack of the plurality of memory stacks is formed by bilayers of a layer of $SiO_2$ 216 on top of a layer of SiN 212 forming an ONON stack. A mask 220 is formed over the memory stacks 204 (step 104). The mask 220 may be a photoresist mask that is formed using a spin on process and a photolithographic patterning. In the alternative, the mask 220 may be a spun on or otherwise applied organic layer, without photolithographic patterning.

Figure 2B:
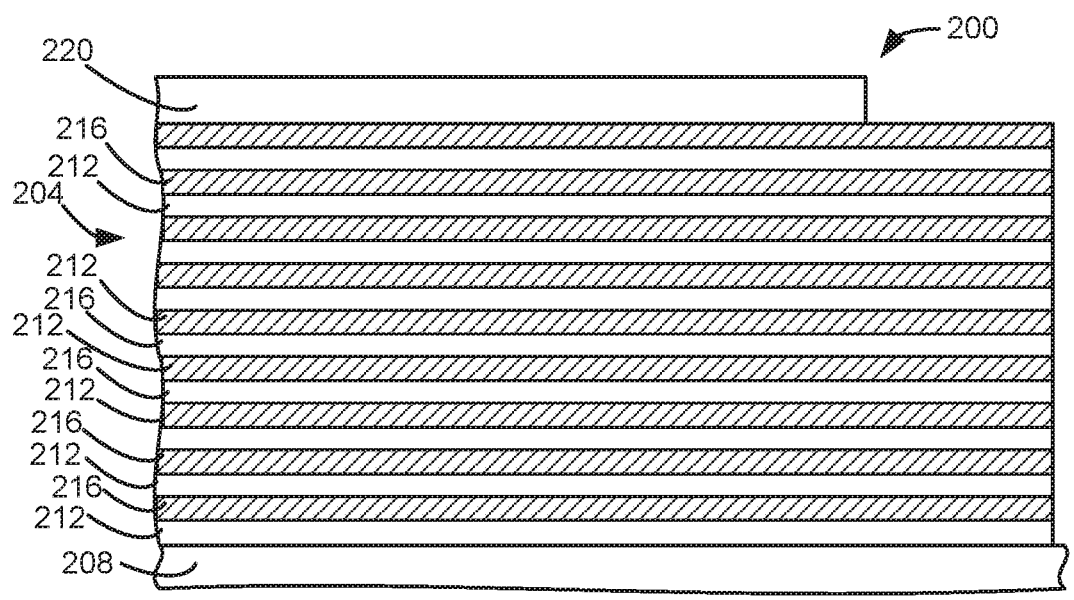

The mask 220 is trimmed (step 108). If the mask 220 is an organic mask, an organic trimming process may be used to trim the mask 220. FIG. 2B is a cross sectional view of the stack 200 after the mask 220 has been trimmed.

Figure 2C:
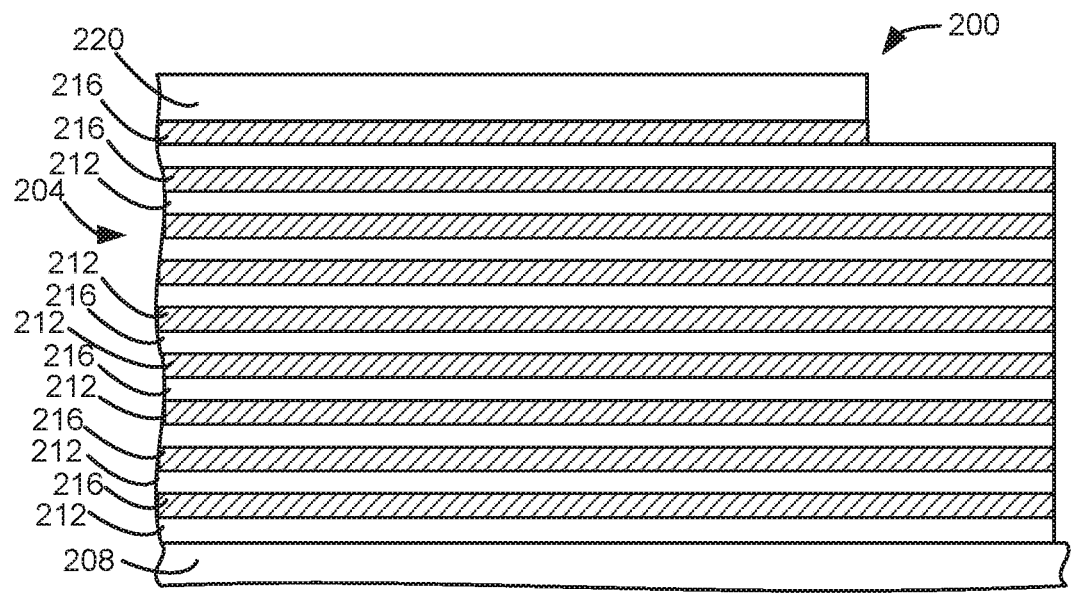
Figure 3:
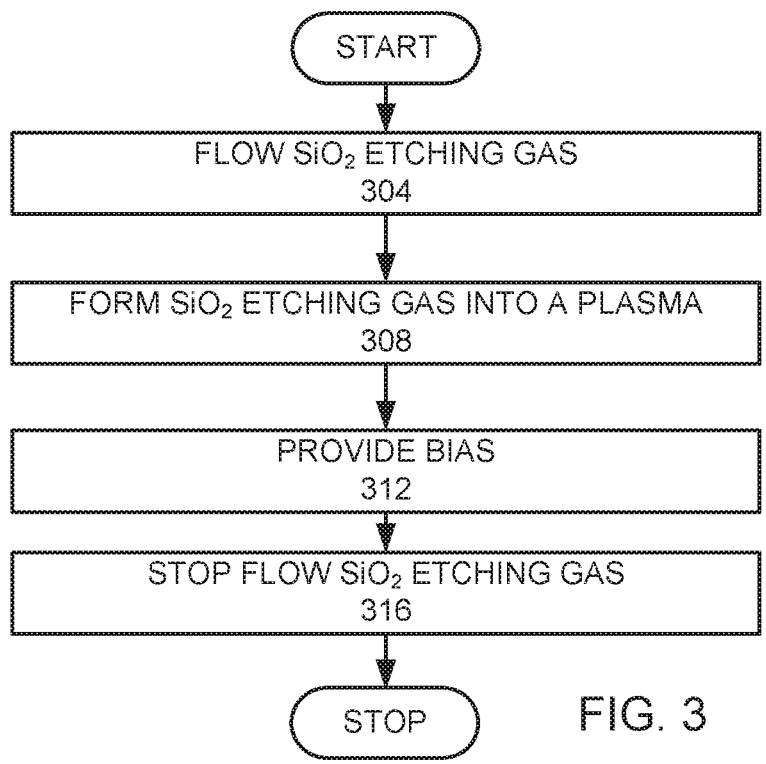
FIG. 3 is a more detailed flow chart of a $SiO_2$ etch process.

After the mask 220 is trimmed (step 108), a plurality of cycles of etching the $SiO_2$ layer (step 112) and etching the SiN layer (step 116) is provided. FIG. 3 is a more detailed flow chart of the etching the $SiO_2$ layer (step 112). A $SiO_2$ etching gas is flowed into a processing chamber (step 304). The $SiO_2$ etching gas comprises a hydrofluorocarbon, an inert bombardment gas, and at least one of sulfur hexafluoride ($SF_6$) and nitrogen trifluoride ($NF_3$). In this example, the $SiO_2$ etching gas consists essentially of 10 to 100 standard cubic centimeters per minute (sccm) $SF_6$, 50-250 sccm fluoroform ($CHF_3$), 100-500 sccm helium (He), and 10-200 sccm $NF_3$. $CHF_3$ is the hydrofluorocarbon. He is the inert bombardment gas. The $SiO_2$ etching gas is formed into a plasma (step 308). Inductively coupled radio frequency (RF) power is provided at 13.56 megahertz (MHz) with a power of at least 2000 watts. A low bias of less than 150 volts (V) is provided (step 312) to cause ion bombardment from helium ions to activate a surface of the stack for ion-assisted etching, wherein the in-situ plasma etches the activated surface of the stack. A chamber pressure of 10 to 20 millitorr (mTorr) is provided. The etch process is stopped after 5 seconds. The etch process may be stopped by stopping the flow of the $SiO_2$ etching gas (step 316). In addition, the RF power may be stopped. FIG. 2C is a cross-sectional view of the stack 200 after a top $SiO_2$ layer 216 has been etched (step 112) in the stack 200. A benefit of the separate $SiO_2$ recipe is that the $SiO_2$ recipe has a lean oxide etch chemistry. The lean oxide etch chemistry provides a vertical ONON etch profile.

Figure 2D:
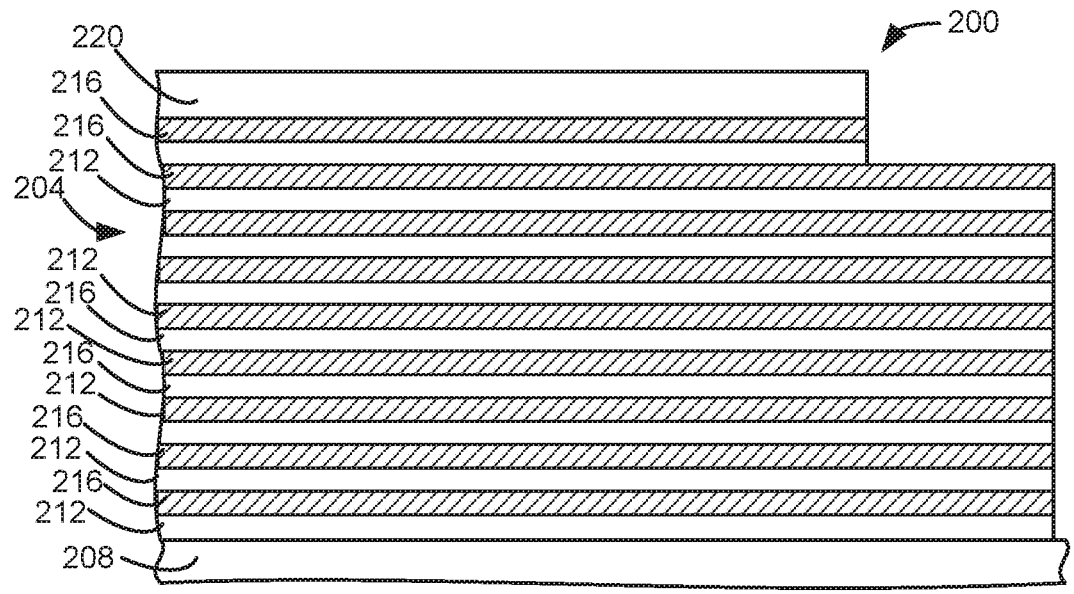
Figure 4:
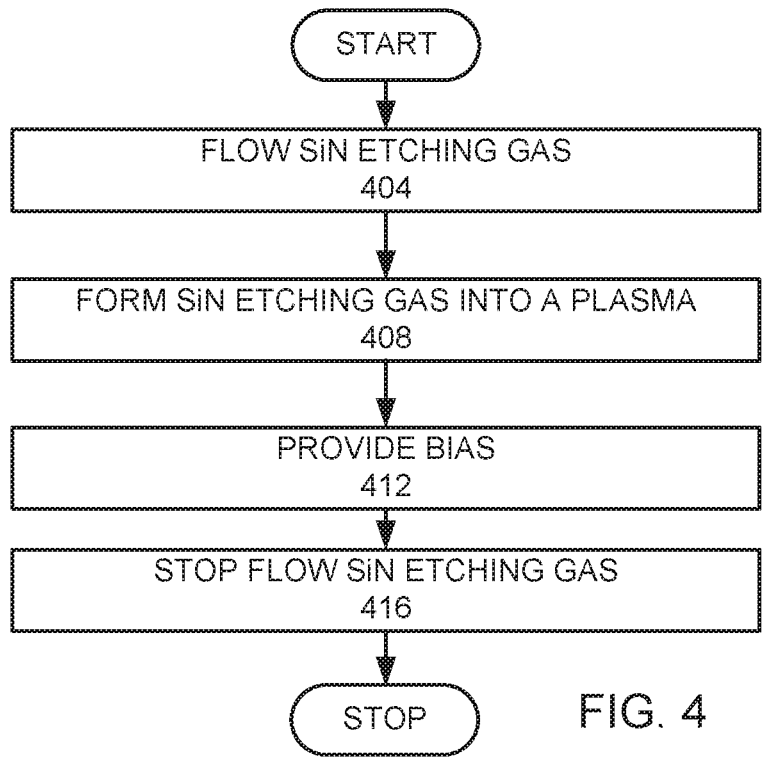
FIG. 4 is a more detailed flow chart of a SiN etch process.

After the etch of the top $SiO_2$ layer 216 is completed (step 112) the top SiN layer 212 is etched (step 116). FIG. 4 is a more detailed flow chart of the etching the SiN layer (step 116). A SiN etching gas is flowed into the processing chamber (step 404). The SiN etching gas comprises a hydrofluorocarbon and oxygen ($O_2$). In this example, the SiN etching gas consists essentially of 50 to 150 sccm carbon tetrafluoride ($CF_4$), 50 to 200 sccm fluoromethane ($CH_3F$), and 50 to 150 sccm $O_2$. $CH_3F$ is the hydrofluorocarbon. The SiN etching gas is formed into a plasma (step 408). Inductively coupled RF power is provided at 13.56 MHz with a power of at least 2000 watts. A bias of 150 to 400 volts is provided (step 412). A chamber pressure of 30 to 100 mTorr is provided. The etch process is stopped after 5 seconds. The etch process may be stopped by stopping the flow of the SiN etching gas (step 416). In addition, the RF power may be stopped. FIG. 2D is a cross-sectional view of the stack 200 after a top SiN layer 212 has been etched (step 116) in the stack 200. Since the etch is selective, the $SiO_2$ layer 216 acts as an etch stop. The top $SiO_2$ layer 216 may act as an etch mask.

Figure 2E:
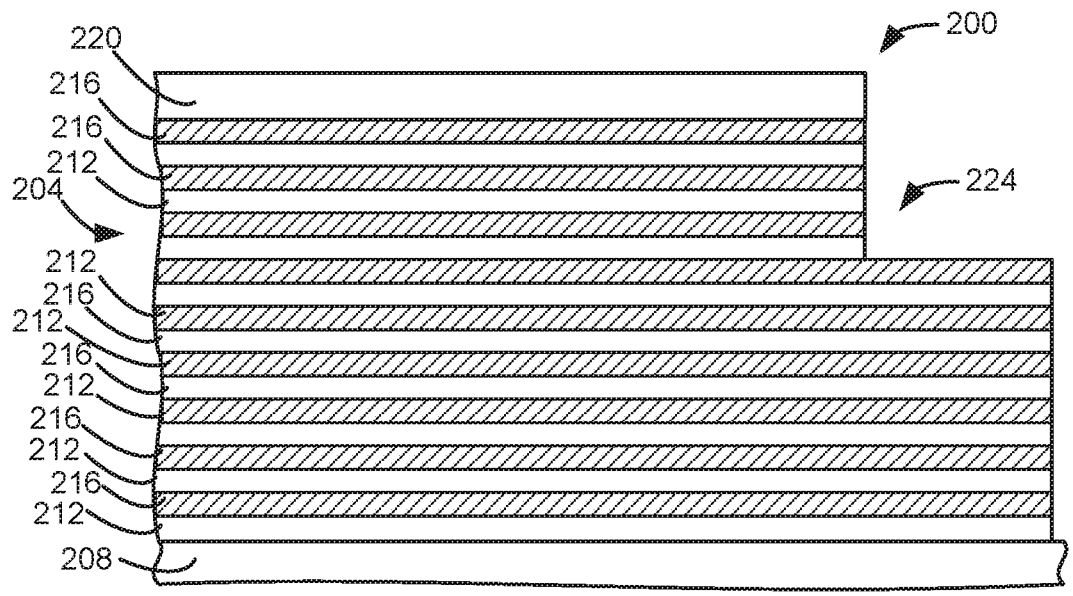

The etching of a $SiO_2$ layer 216 (step 112) and the etching of a SiN layer 212 (step 116) are repeated (step 120) twice. FIG. 2E is a cross-sectional view of the stack 200 after the etching of a $SiO_2$ layer 216 (step 112) and the etching of a SiN layer 212 (step 116) are repeated (step 120) twice. A first step 224 of a height of three bilayers has been etched.

Figure 2F:
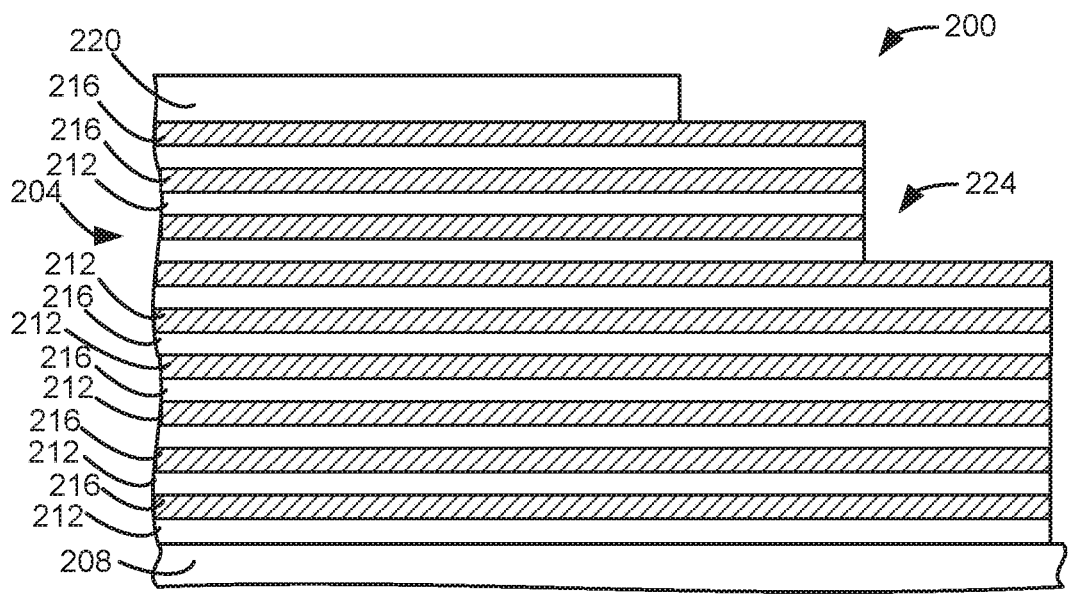

The stair is not complete (step 124) and the process is returned to the step of trimming the mask (step 108). An example of a recipe for trimming an organic mask provides a pressure between 30 to 400 mTorr. A trim gas is flowed into a process chamber, where the trimming gas is 1000 sccm $O_2$, 40 sccm $N_2$, and 50 sccm $C_4F_6$ or $NF_3$. The trimming gas is formed into a plasma. The trimming gas is stopped when the trim is completed. FIG. 2F is a cross-sectional view of the stack 200, after the mask 220 is trimmed.

Figure 2G:
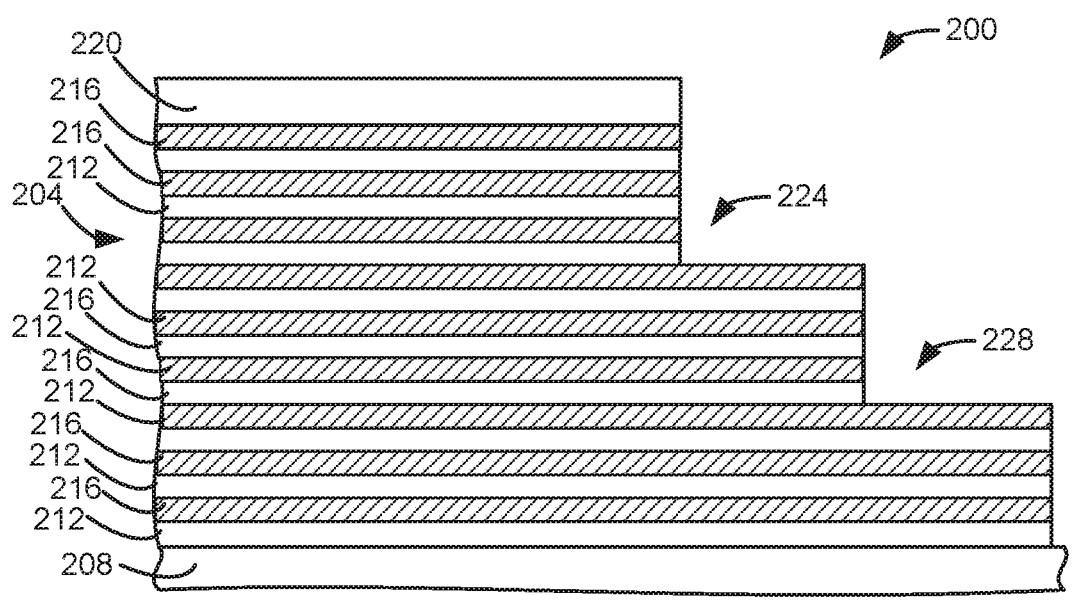

The steps of etching a $SiO_2$ layer 216 (step 112) and etching a SiN layer 212 (step 116) are cyclically performed three times. The stair step etching in this embodiment is completed (step 124). FIG. 2G is a cross-sectional view of the stack 200 after a second stair-step 228 has been etched. In this example, three bilayers of $SiO_2$ and SiN are etched to form the second step 228, while deepening the first step 224. The deepening of the first step 224 etches the first step, without using a mask and provides a vertical sidewall and a corner, without faceting.

The completed stair provides an improved structure over stairs created using other processes in a manner that is faster than other processes. The above embodiment has less tapering than using a process that uses more polymer to increase selectivity. Because the process uses a low bias for etching at least one layer of each bilayer, faceting and corner rounding is reduced. Normally, a lower bias would result in a lower throughput. However, the chemistries of the $SiO_2$ etching gas and the SiN etching gas are able to provide a high throughput with a low bias. In addition, a higher bias may be used for etching only one layer of the bilayer. In addition, this embodiment decreases line edge roughness. Since each step in this embodiment is three bilayers, in this embodiment, the stack has at least six bilayers of $SiO_2$ and SiN.

The stair-steps may be formed in one or more directions (X or Y) in other embodiments. In other embodiments, other feature shapes may be etched into a plurality of silicon oxide and silicon nitride bilayers. Various embodiments reduce corner faceting and sidewall etching on non-stair step structures, while increasing the etch rate of the bilayers.

In other embodiments, the first layer is a silicon nitride layer. In various embodiments, subsequent steps may be provided, such as removing any remaining mask 220. Various embodiments may be used to etch high aspect ratio features, such as contacts.

In various embodiments, the $SiO_2$ etch gas comprises a hydrofluorocarbon, an inert bombardment gas, and at least one of $SF_6$ or $NF_3$. In various embodiments, the $SiO_2$ etch gas is oxygen free. The presence of oxygen during etching the $SiO_2$ layer (step 112), can cause the organic mask 220 to be laterally etched during the $SiO_2$ vertical etch (step 112). The lateral etch of the organic mask reduces profile control. In various embodiments, the hydrofluorocarbon may be at least one of $CH_2F_2$, $CH_3F$, or $CHF_3$.

In various embodiments, the bias provided during the etching the SiN layer (step 116) has a magnitude that is greater than the magnitude of the bias during the etching the $SiO_2$ layer (step 112). For example, in some embodiments, the etching the SiN layer (step 116) has a bias magnitude of between 150 to 400 volts, inclusive, and the etching the $SiO_2$ layer (step 112) has a bias of less than 150 volts. In other embodiments, the etching the SiN layer (step 116) has a bias magnitude of between 150 to 700 volts and the etching the $SiO_2$ layer (step 112) has a bias between 20 to 100 volts, inclusive.

In various embodiments, the chamber pressure during the etching the SiN layer (step 116) is greater than the chamber pressure during the etching the $SiO_2$ layer (step 112). For example, in some embodiments, the etching the SiN layer (step 116) has a chamber pressure greater than 30 mTorr, such as between 30 mTorr and 100 mTorr, and the etching the $SiO_2$ layer (step 112) has a chamber pressure less than 20 mTorr.

Various embodiments provide a fast etch process and increased throughput. For example, the etching of the $SiO_2$ layer (step 112) may be performed in no more than 10 seconds. In various embodiments, the etching of the SiN layer (step 116) may be performed in no more than 10 seconds. In various embodiments, the etching of the SiN layer (step 116) may be performed in no more than 5 seconds. In various embodiments, the etching of a bilayer of SiN and $SiO_2$ may be performed in no more than 15 seconds.

In various embodiments, the etching the SiN layer (step 116) selectively etches the SiN layer 212 with respect to $SiO_2$ layer 216 with a selectivity in the range of 2:1 to 4:1. The etching the SiN layer (step 116) also selectively etches the SiN layer 212 with respect to the mask 220. In various embodiments, the etching of the SiO$_2$ layer (step 112) selectively etches the SiO$_2$ layer 216 with respect to the mask 220. The etching the SiO$_2$ layer (step 112) does not selectively etch the SiO$_2$ layer 216 with respect to the SiN layer 212. Endpoint control is used to stop the etching of the SiO$_2$ layer 216.

In an embodiment, the stack comprises at least six bilayers of silicon oxide and silicon nitride. In another embodiment, the stack comprises more than 60 bilayers of silicon oxide and silicon nitride. In the above embodiment, each stair step is three bilayers. In other embodiments, each stair step may be from three to ten bilayers. In such embodiments, the etching of the SiO$_2$ layer (step 112) and the etching of the SiN layer (step 116) are cyclically repeated for three to ten times for each stair step. If a stack has more than 60 bilayers and there are three bilayers in each step, a stair step etch process may be repeated at least twenty times. In such an embodiment, depending on the thickness of the mask 220 and the selectivity of an etch process, the mask 220 may be only useful for forming around seven stair steps. In such a case, a new mask 220 may be formed every seven stair steps, so that at least three masks 220 are applied during the etching of the at least twenty stair steps.

In an embodiment, during the flowing of the SiN etching gas, at least some of the hydrofluorocarbon is flowed from sides of the plasma processing chamber in a direction with a component that is parallel to a top surface of the top of the stack 200. As a result, the hydrofluorocarbon flowed from the sides of the plasma processing chamber flows first over the sides of the substrate 208 towards the center of the substrate 208, where in this example the substrate 208 is in the form of a disk. The ratio of the flow of hydrofluorocarbon from the top of the plasma processing chamber to the flow of the hydrofluorocarbon from the sides of the plasma processing chamber may be used as a tuning knob. The tuning knob allows tuning to improve process uniformity. In this embodiment, hydrofluorocarbon is not flowed from the sides of the plasma processing chamber during the flowing of the SiO$_2$ etching gas.

Figure 5:
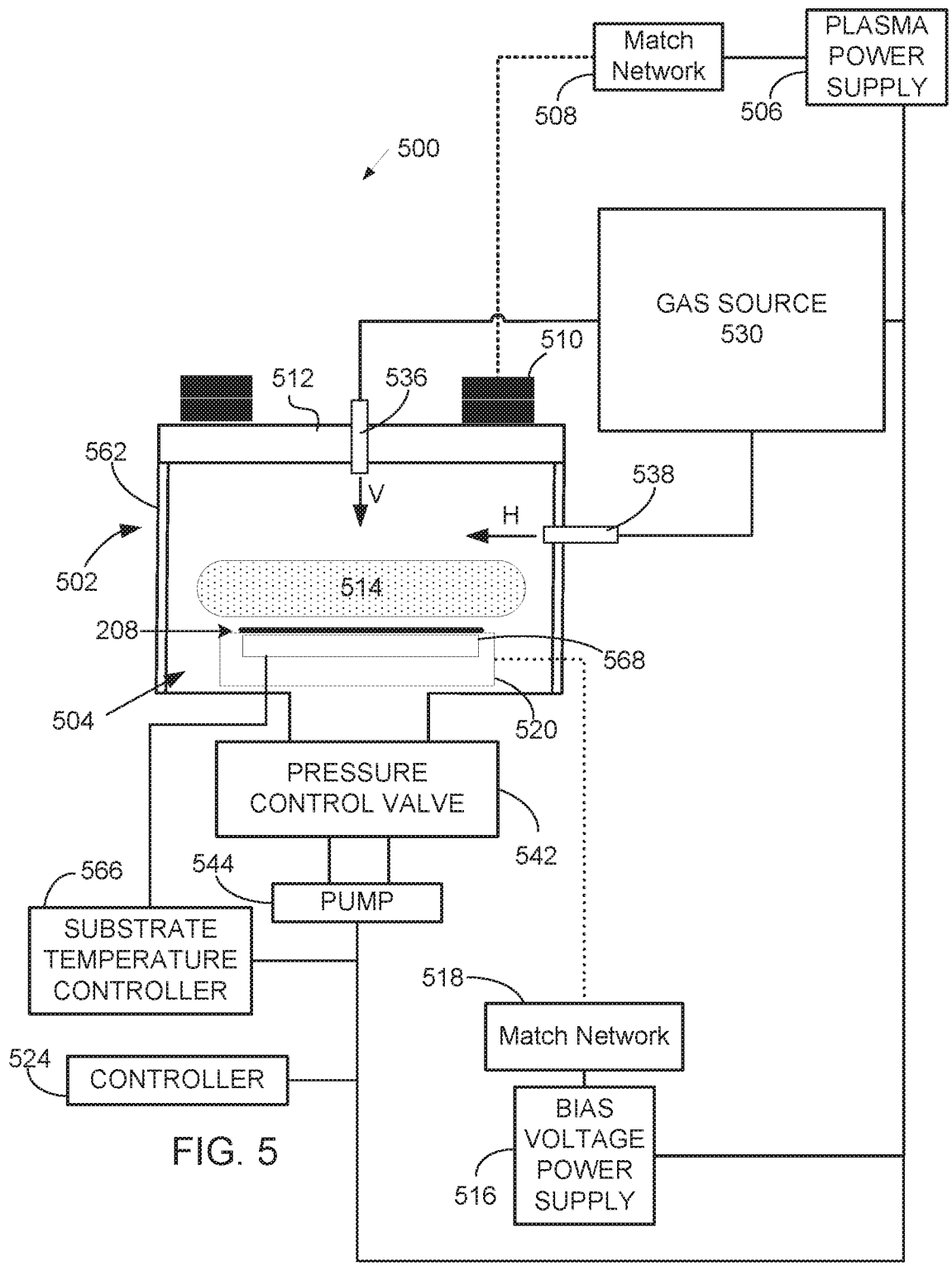
FIG. 5 is a schematic view of a plasma processing chamber that may be used in practicing the disclosure.

FIG. 5 schematically illustrates an example of a plasma processing system 500 which may be used to process the substrate 208 in accordance with one embodiment. The plasma processing system 500 includes a plasma reactor 502 having a plasma processing chamber 504, enclosed by a chamber wall 562. A plasma power supply 506, tuned by a match network 508, supplies power to a transformer coupled plasma (TCP) coil 510 located near a power window 512 to create a plasma 514 in the plasma processing chamber 504 by providing an inductively coupled power. The TCP coil (upper power source) 510 may be configured to produce a uniform diffusion profile within the plasma processing chamber 504. For example, the TCP coil 510 may be configured to generate a toroidal power distribution in the plasma 514. The power window 512 is provided to separate the TCP coil 510 from the plasma processing chamber 504 while allowing energy to pass from the TCP coil 510 to the plasma processing chamber 504. A wafer bias voltage power supply 516 tuned by a match network 518 provides power to an electrode 520 to set the bias voltage on the substrate 208. The electrode 520 provides a chuck for the substrate 208, where the electrode 520 acts as an electrostatic chuck. A substrate temperature controller 566 is controllably connected to a Peltier heater/cooler 568. A controller 524 sets points for the plasma power supply 506, the substrate temperature controller 566, and the wafer bias voltage power supply 516.

The plasma power supply 506 and the wafer bias voltage power supply 516 may be configured to operate at specific radio frequencies such as, 13.56 MHz, 27 MHz, 2 MHz, 400 kilohertz (kHz), or combinations thereof. Plasma power supply 506 and wafer bias voltage power supply 516 may be appropriately sized to supply a range of powers in order to achieve desired process performance. For example, in one embodiment, the plasma power supply 506 may supply the power in a range of 50 to 5000 Watts, and the wafer bias voltage power supply 516 may supply a bias voltage in a range of 20-1500 V. In addition, the TCP coil 510 and/or the electrode 520 may be comprised of two or more sub-coils or sub-electrodes, which may be powered by a single power supply or powered by multiple power supplies.

As shown in FIG. 5, the plasma processing system 500 further includes a gas source 530. The gas source 530 provides gas or remote plasma to a center feed 536 and a side feed 538. The center feed 536 and the side feed 538 are in the form of nozzles. The center feed 536 is located approximately above the center of the substrate 208. The side feed 538 may be one or more nozzles located closer to sides of the substrate 208 than the center of the substrate 208. The center feed 536 provides gas with more of a vertical component. The vertical component is perpendicular to the surface of the substrate 208, as shown by arrow V. The side feed 538 has more of a horizontal component than the center feed. The horizontal component is parallel to the surface of the substrate 208, as shown by arrow H. As shown, the gas from the side feed 538 passes from the sides of the substrate 208 towards the center of the substrate 208. The process gases and byproducts are removed from the plasma processing chamber 504 via a pressure control valve 542 and a pump 544, which also serve to maintain a particular pressure within the plasma processing chamber 504. The gas source 530 is controlled by the controller 524. A Kiyo by Lam Research Corp. of Fremont, Calif., may be used to practice an embodiment.

Figure 6:
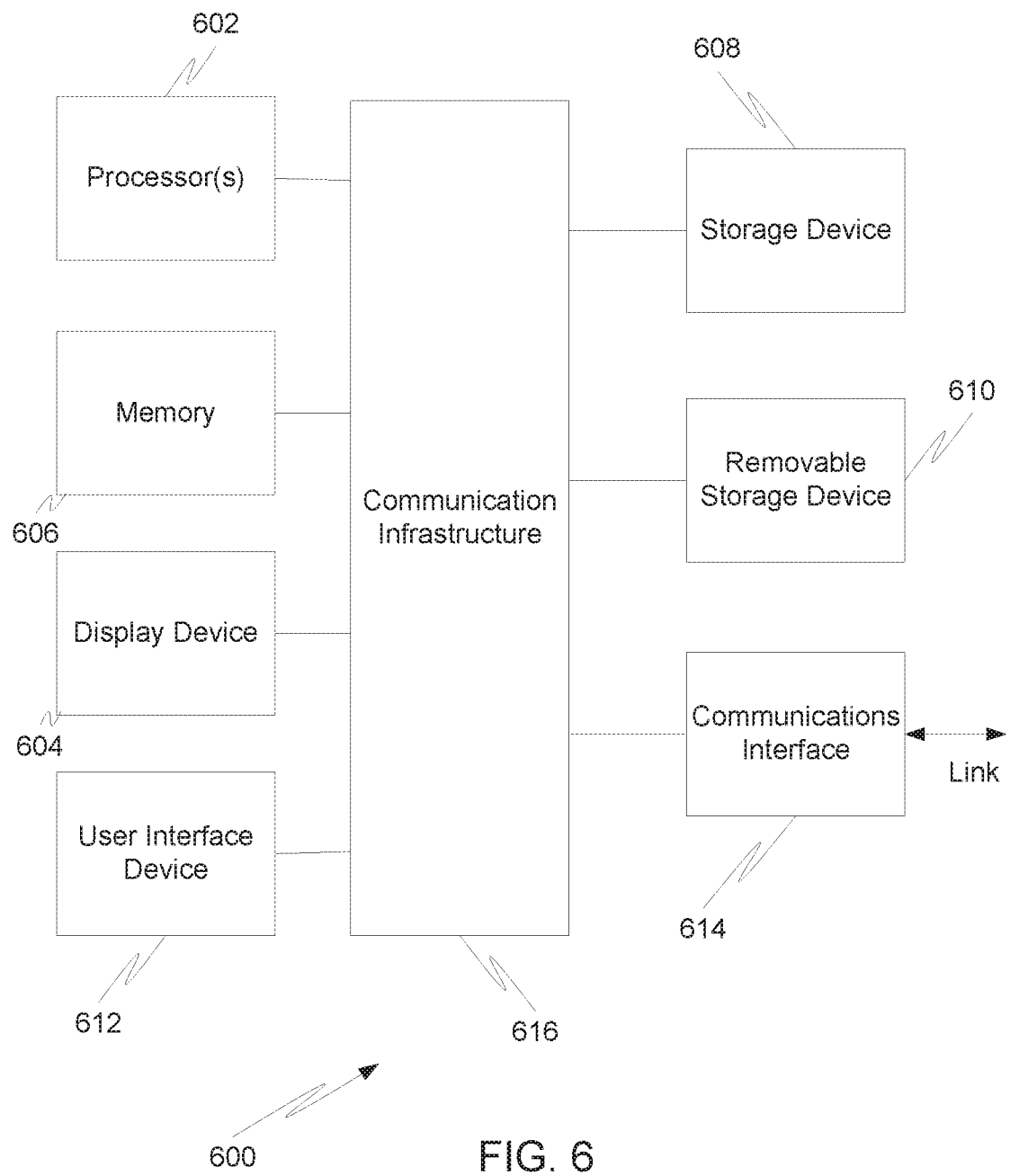
FIG. 6 illustrates a computer system, which is suitable for implementing a controller used in embodiments of the present disclosure.

FIG. 6 is a high level block diagram showing a computer system 600, which is suitable for implementing a controller 524 used in embodiments of the present disclosure. The computer system may have many physical forms ranging from an integrated circuit, a printed circuit board, and a small handheld device up to a huge super computer. The computer system 600 includes one or more processors 602, and further can include an electronic display device 604 (for displaying graphics, text, and other data), a main memory 606 (e.g., random access memory (RAM)), storage device 608 (e.g., hard disk drive), removable storage device 610 (e.g., optical disk drive), user interface devices 612 (e.g., keyboards, touch screens, keypads, mice or other pointing devices, etc.), and a communication interface 614 (e.g., wireless network interface). The communication interface 614 allows software and data to be transferred between the computer system 600 and external devices via a link. The system may also include a communications infrastructure 616 (e.g., a communications bus, cross-over bar, or network) to which the aforementioned devices/modules are connected.

Information transferred via communications interface 614 may be in the form of signals such as electronic, electromagnetic, optical, or other signals capable of being received by communications interface 614, via a communication link that carries signals and may be implemented using wire or cable, fiber optics, a phone line, a cellular phone link, a radio frequency link, and/or other communication channels. With such a communications interface, it is contemplated that the one or more processors 602 might receive information from a network, or might output information to the network in the course of performing the above-described method steps. Furthermore, method embodiments of the present disclosure may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The controller 524 is used to provide a tuned ratio of the flow of hydrofluorocarbon flowed through the center feed 536 and the flow of the hydrofluorocarbon flowed through the side feed 538. The tuning allows control of the ratio of the flow of the hydrofluorocarbon perpendicular to the surface of the substrate 208 with respect to the flow of the hydrofluorocarbon parallel to the surface of the substrate 208.

While this disclosure has been described in terms of several preferred embodiments, there are alterations, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A method for forming a stair-step structure in a stack on a substrate in a plasma processing chamber, wherein the stack comprises a plurality of silicon oxide and silicon nitride bilayers under a mask, comprising at least one stair step cycle, wherein each stair step cycle comprises:
   trimming the mask; and
   etching the stack in a plurality of cycles, wherein each cycle comprises:
      etching a $SiO_2$ layer, comprising:
         flowing a $SiO_2$ etching gas into the plasma processing chamber, wherein the $SiO_2$ etching gas comprises a hydrofluorocarbon, an inert bombardment gas, and at least one of $SF_6$ and $NF_3$;
         generating a plasma from the $SiO_2$ etching gas;
         providing a bias; and
         stopping the $SiO_2$ layer etch; and
      etching a SiN layer, wherein the SiN layer is selectively etched with respect to the $SiO_2$ layer and the mask, comprising:
         flowing a SiN etching gas into the plasma processing chamber, wherein the SiN etching gas comprises a hydrofluorocarbon and oxygen;
         generating a plasma from the SiN etching gas;
         providing a bias; and
         stopping the SiN layer etch.

2. The method, as recited in claim 1, wherein the $SiO_2$ etching gas is oxygen free.

3. The method, as recited in claim 2, wherein the $SiO_2$ etching gas comprises $SF_6$ and $NF_3$.

4. The method, as recited in claim 2, wherein the $SiO_2$ etching gas comprises $SF_6$.

5. The method, as recited in claim 1, wherein the method comprises at least twenty stair step cycles.

6. The method, as recited in claim 1, wherein the inert bombardment gas is He.

7. The method, as recited in claim 1, wherein the hydrofluorocarbon in the SiN etching gas is at least one of $CH_2F_2$, $CH_3F$, and $CHF_3$.

8. The method, as recited in claim 1, wherein the bias during the etching of the SiN layer has a magnitude that is greater than or equal to a magnitude of the bias during the etching of the $SiO_2$ layer.

9. The method, as recited in claim 1, wherein the bias during the etching of the SiN layer has a magnitude that is between 150 to 400 volts inclusive and the bias during the etching of the $SiO_2$ layer has a magnitude that is less than 150 volts.

10. The method, as recited in claim 1, further comprising providing a pressure of greater than 30 mTorr during the etching of the SiN layer and providing a pressure of less than 20 mTorr during the etching of the $SiO_2$ layer.

11. The method, as recited in claim 1, wherein the etching the SiN layer is less than 10 seconds for each cycle and the etching the $SiO_2$ layer is less than 10 seconds for each cycle.

12. The method, as recited in claim 1, wherein the etching the stack comprises three to ten cycles.

13. The method, as recited in claim 1, wherein the stack comprises more than 60 bilayers.

14. The method, as recited in claim 1, wherein the flowing a SiN etching gas into the plasma processing chamber flows the hydrofluorocarbon through a center feed and a side feed, wherein the center feed includes one or more nozzles and the side feed includes one or more nozzles that are closer to sides of the substrate than a center of the substrate.

15. The method, as recited in claim 14, wherein the one or more nozzles of the side feed flow hydrofluorocarbon in a direction from the sides of the substrate towards the center of the substrate.

16. The method, as recited in claim 1, wherein the etching of the SiN layer has a SiN to $SiO_2$ etch selectivity in the range of 2:1 to 4:1.

17. The method, as recited in claim 16, wherein the $SiO_2$ etch does not selectively etch the $SiO_2$ layer with respect to the SiN layer.

18. The method, as recited in claim 1, wherein the $SiO_2$ etching gas comprises $SF_6$ and $NF_3$.

19. The method, as recited in claim 1, wherein the $SiO_2$ etching gas comprises $SF_6$.

* * * * *